(12) United States Patent
Shimizu et al.

(10) Patent No.: US 12,286,144 B2
(45) Date of Patent: Apr. 29, 2025

(54) TRAVELLING VEHICLE AND TRAVELLING VEHICLE SYSTEM

(71) Applicant: MURATA MACHINERY, LTD., Kyoto (JP)

(72) Inventors: Yuji Shimizu, Ise (JP); Seiji Yamagami, Kyoto (JP)

(73) Assignee: MURATA MACHINERY, LTD., Kyoto (JP)

( * ) Notice: Subject to any disclaimer, the term of this patent is extended or adjusted under 35 U.S.C. 154(b) by 125 days.

(21) Appl. No.: 18/278,456

(22) PCT Filed: Jan. 25, 2022

(86) PCT No.: PCT/JP2022/002699
§ 371 (c)(1),
(2) Date: Aug. 23, 2023

(87) PCT Pub. No.: WO2022/185787
PCT Pub. Date: Sep. 9, 2022

(65) Prior Publication Data
US 2024/0132123 A1    Apr. 25, 2024
US 2024/0227881 A9    Jul. 11, 2024

(30) Foreign Application Priority Data

Mar. 4, 2021   (JP) ................................ 2021-034599

(51) Int. Cl.
*H01L 21/67*  (2006.01)
*B61L 15/00*  (2006.01)
*B61L 25/02*  (2006.01)
*B61L 25/04*  (2006.01)
*B61L 27/16*  (2022.01)
(Continued)

(52) U.S. Cl.
CPC ......... *B61L 15/0058* (2024.01); *B61L 15/009* (2013.01); *B61L 25/021* (2013.01); *B61L 25/04* (2013.01); *B61L 27/16* (2022.01); *G06V 10/56* (2022.01); *G06V 20/56* (2022.01)

(58) Field of Classification Search
CPC ............. B61L 15/008; H01L 21/67259; H01L 21/67733; G06V 10/255
See application file for complete search history.

(56) References Cited

U.S. PATENT DOCUMENTS 7,343,660 B1 * 3/2008 Lemelson .............. B23Q 41/06
901/6
2019/0302757 A1 * 10/2019 Sato .................... G06F 3/04847
(Continued)

FOREIGN PATENT DOCUMENTS

JP    11-202940 A     7/1999
JP    2019-091224 A   6/2019

*Primary Examiner* — Long T Tran
(74) *Attorney, Agent, or Firm* — Keating & Bennett, LLP

(57) ABSTRACT

A travelling vehicle includes a body including a small marker and a large marker, an imager, a pattern recognizer, and a state determiner. The large marker includes a display pattern including a first region, a second region with a lower reflectance than a reflectance of the first region, and a region where the small marker is located. The small marker has a display pattern including a third region with a lower reflectance than the reflectance of the first region and a fourth region with a lower reflectance than the reflectance of the third region and a lower reflectance than the reflectance of the second region.

16 Claims, 8 Drawing Sheets

(51) Int. Cl.
    *G06V 10/56*        (2022.01)
    *G06V 20/56*        (2022.01)

(56)            References Cited

U.S. PATENT DOCUMENTS

2020/0317118 A1* 10/2020 Yesh .................... G05D 1/0297
2020/0401158 A1* 12/2020 Kitano .................... G06T 7/70
2021/0112647 A1*  4/2021 Coleman ................ G01S 17/42
2021/0316721 A1* 10/2021 Lim .................... B62D 15/0285
2022/0011780 A1*  1/2022 Nguyen ............... G05D 1/0293
2022/0269280 A1*  8/2022 Yamagami ........... G06V 30/224
2023/0351609 A1* 11/2023 Freedman ................. G06T 7/20

* cited by examiner

TRAVELLING VEHICLE AND TRAVELLING VEHICLE SYSTEM

BACKGROUND OF THE INVENTION

1. Field of the Invention

An aspect of the present invention relates to a travelling vehicle and a travelling vehicle system.

2. Description of the Related Art

A travelling vehicle system in which a plurality of travelling vehicles travel on a predetermined path has been known. For example, Japanese Unexamined Patent Publication No. H11-202940 discloses a travelling vehicle system in which each travelling vehicle monitors another vehicle by a sensor, compares the distance to the other travelling vehicle with a remaining travelling distance, and if the remaining travelling distance is shorter than the distance to the other travelling vehicle, the travelling vehicle is caused to continue travelling at a low speed.

In addition, Japanese Unexamined Patent Publication No. 2019-91224 discloses an electronic system that includes a marker provided on an object and an imager capable of capturing the marker, and that performs some control when the marker is captured by the imager. In addition, in Japanese Unexamined Patent Publication No. 2019-91224, a marker with a large surface area (large marker) and a marker with a small surface area (small marker) are arranged side by side, so that either marker fits within the image capturing range of the imager, regardless of whether the distance between the imager and the marker is far or close.

SUMMARY OF THE INVENTION

However, the limited space available for affixing markers to a travelling vehicle makes it difficult to affix a large marker and a small marker side by side. For example, when using the technology disclosed in Japanese Unexamined Patent Publication No. 2019-91224 for the control of a travelling vehicle, the imager needs to reliably recognize at least one of the markers.

Preferred embodiments of the present invention provide travelling vehicles and travelling vehicle systems that each enable one travelling vehicle to more reliably recognize another travelling vehicle regardless of the inter-vehicle distance between the two travelling vehicles.

A travelling vehicle according to an aspect of a preferred embodiment of the present invention is a travelling vehicle to travel along a predetermined travelling path, the travelling vehicle including a body including a small marker and a large marker with a larger surface area than a surface area of the small marker, at least one imager provided on the body such that an image capturing range of the at least one imager is at least one of a front and a rear of the travelling vehicle that is a subject travelling vehicle, a pattern recognizer to distinctively recognize the small marker and the large marker based on a captured image acquired by the at least one imager, and a state determiner to determine that the travelling vehicle that is another travelling vehicle is present in at least one of the front and the rear of the subject travelling vehicle when the small marker or the large marker is recognized by the pattern recognizer, in which the large marker is of a size that does not entirely fit within the image capturing range of the at least one imager in the other travelling vehicle that is located less than a predetermined distance from the subject travelling vehicle, the small marker is of a size that entirely fits within the image capturing range of the at least one imager in the other travelling vehicle when a distance from the subject travelling vehicle is less than the predetermined distance from the subject travelling vehicle, the small marker being inside a region where the large marker is located, the large marker includes a display pattern including a first region, a second region with a lower reflectance than a reflectance of the first region and a region where the small marker is located, and the small marker includes a display pattern including a third region with a lower reflectance than the reflectance of the first region and a fourth region with a lower reflectance than the reflectance of the third region and a lower reflectance than the reflectance of the second region.

With the travelling vehicle of this configuration, even when the inter-vehicle distance between two travelling vehicles is relatively close, the pattern recognizer can recognize the small marker because the small marker is captured by the at least one imager. Also, with the travelling vehicle of this configuration, when the inter-vehicle distance between the two travelling vehicles is relatively far, the small marker and the large marker are captured by the at least one imager, but the third region of the small marker has a lower reflectance than that of the first region of the large marker and the fourth region of the small marker has a lower reflectance than that of the second region of the large marker, the pattern recognizer can easily recognize the entire small marker as the second region of the large marker. This allows the pattern recognizer to more reliably recognize the large marker from a captured image in which the small marker and large marker are captured. As a result, one travelling vehicle can more reliably recognize the other travelling vehicle regardless of the inter-vehicle distance between the two travelling vehicles. Note that reflectance here means the reflectance when visible or infrared light is used for irradiation.

In a travelling vehicle according to an aspect of a preferred embodiment of the present invention, the small marker may include the third region and the fourth region located inside a fifth region that defines a frame, and the fifth region may have a lower reflectance than the reflectance of the first region of the large marker and a higher reflectance than the reflectance of the fourth region of the small marker. This configuration allows the pattern recognizer to more reliably recognize the large marker from a captured image in which the small marker and the large marker are captured.

In a travelling vehicle according to an aspect of a preferred embodiment of the present invention, the pattern recognizer may recognize the small marker by recognizing a first color scheme pattern obtained by binarizing the small marker so that a region corresponding to the third region is white and a region corresponding to the fourth region is black, and recognize the large marker by recognizing a second color scheme pattern obtained by binarizing the large marker so that a region corresponding to the first region is white and regions corresponding to the second region and the regions of the small marker are black. In this configuration, the small marker and large marker can be recognized from a captured image using a simple processing method.

In a travelling vehicle according to an aspect of a preferred embodiment of the present invention, the large marker and the small marker may have different display patterns from each other, and the state determiner may determine that a distance from the subject travelling vehicle to the other travelling vehicle is smaller when the small marker is recognized by the pattern recognizer compared to when the large marker is recognized. This configuration allows detection of the distance to a travelling vehicle located at the front or the rear.

In a travelling vehicle according to an aspect of a preferred embodiment of the present invention, the body may be further provided with a first display that does not entirely fit within the image capturing range of the at least one imager in the other travelling vehicle that is located less than the predetermined distance from the subject travelling vehicle, the first display being operable to switch a display mode in accordance with a state of the subject travelling vehicle, and a second display that entirely fits within the image capturing range of the at least one imager in the other travelling vehicle when a distance from the subject travelling vehicle is less than the predetermined distance from the subject travelling vehicle, the second display being operable to switch a display mode in accordance with a state of the subject travelling vehicle, the travelling vehicle may further include a driver to cause the body to travel along the travelling path, and a travelling controller configured or programmed to acquire a state of the other travelling vehicle based on the display mode of at least one of the first display and the second display captured by the at least one imager and control the driver based on the state that has been acquired.

In a travelling vehicle of this configuration, since a display manner that varies according to a state of the travelling vehicle is displayed on the first display and the second display, one travelling vehicle that has acquired the display manners of the first display or the second display with the at least one imager can determine the state of the other travelling vehicle instantaneously. With this configuration, the one travelling vehicle can promptly perform operation appropriate for the state of the other travelling vehicle. In addition, the travelling vehicle of this configuration includes the first display and the second display, so that even if the inter-vehicle distance between the two travelling vehicles is relatively close or far, the at least one imager captures at least one of the first display and the second display. This allows the one travelling vehicle to more reliably acquire information on the other travelling vehicle regardless of the inter-vehicle distance between the two travelling vehicles.

In a travelling vehicle according to an aspect of a preferred embodiment of the present invention, the first display and the second display each may switch the display mode according to a travelling state of the subject travelling vehicle, and the travelling state may include an accelerated state and a decelerated state. This configuration enables the other travelling vehicle to grasp at least whether the subject travelling vehicle is in the accelerated state or the decelerated state.

A travelling vehicle system according to an aspect of a preferred embodiment of the present invention may include a plurality of the travelling vehicles described above, a track along which the travelling vehicles travel in a predetermined direction, and a travelling vehicle controller configured or programmed to assign a transportation command to the travelling vehicles. In this travelling vehicle system, one or more travelling vehicles can more reliably recognize another travelling vehicle regardless of the inter-vehicle distance between the two travelling vehicles.

According to preferred embodiments of the present invention, travelling vehicles can more reliably recognize other travelling vehicles regardless of the inter-vehicle distance between two travelling vehicles.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments according to aspects of preferred embodiments of the present invention will be described in detail below with reference to the drawings. In the description of the drawings, identical elements or features will be denoted by identical reference signs and redundant explanations will be omitted.

First Preferred Embodiment

Figure 1:
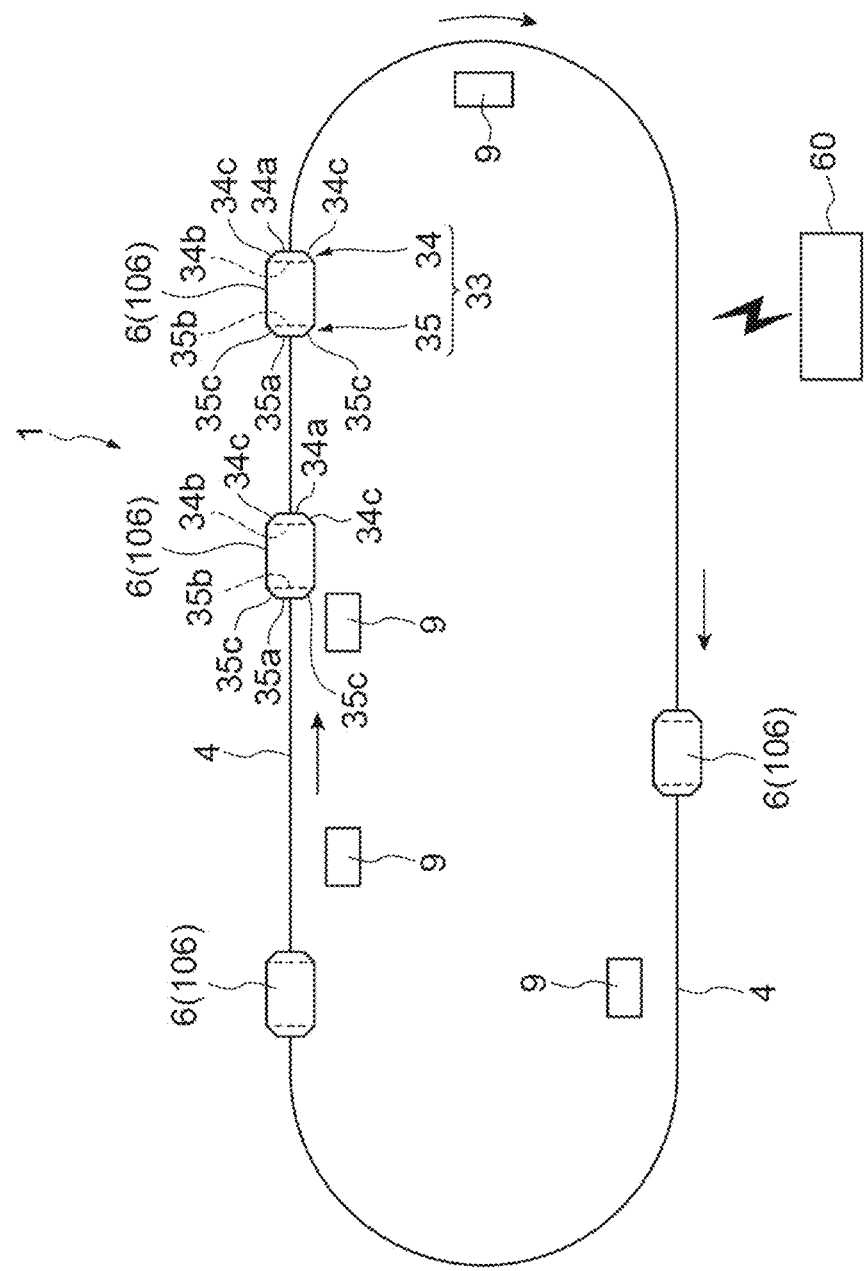
FIG. 1 is a schematic configuration diagram illustrating a travelling vehicle system according to a first preferred embodiment of the present invention.

With reference to FIG. 1 to FIG. 6 mainly, a travelling vehicle system 1 of a first preferred embodiment will be described. The travelling vehicle system 1 is a system to transport, by using an overhead travelling vehicle 6 capable of moving along a track (predetermined travelling path) 4, an article 10 between placement sections 9 and 9. Examples of the article 10 include containers such as a front opening unified pod (FOUP) storing a plurality of semiconductor wafers and a reticle pod storing a glass substrate, and common parts. In this case, the travelling vehicle system 1 in which, for example, the overhead travelling vehicle 6 (hereinafter simply referred to as "travelling vehicle 6") travels along the one-way track 4 that is laid on a ceiling or the like of a factory will be described as an example. As illustrated in FIG. 1, the travelling vehicle system 1 includes the track 4, a plurality of the placement sections 9, and a plurality of the travelling vehicles 6.

Figure 2:
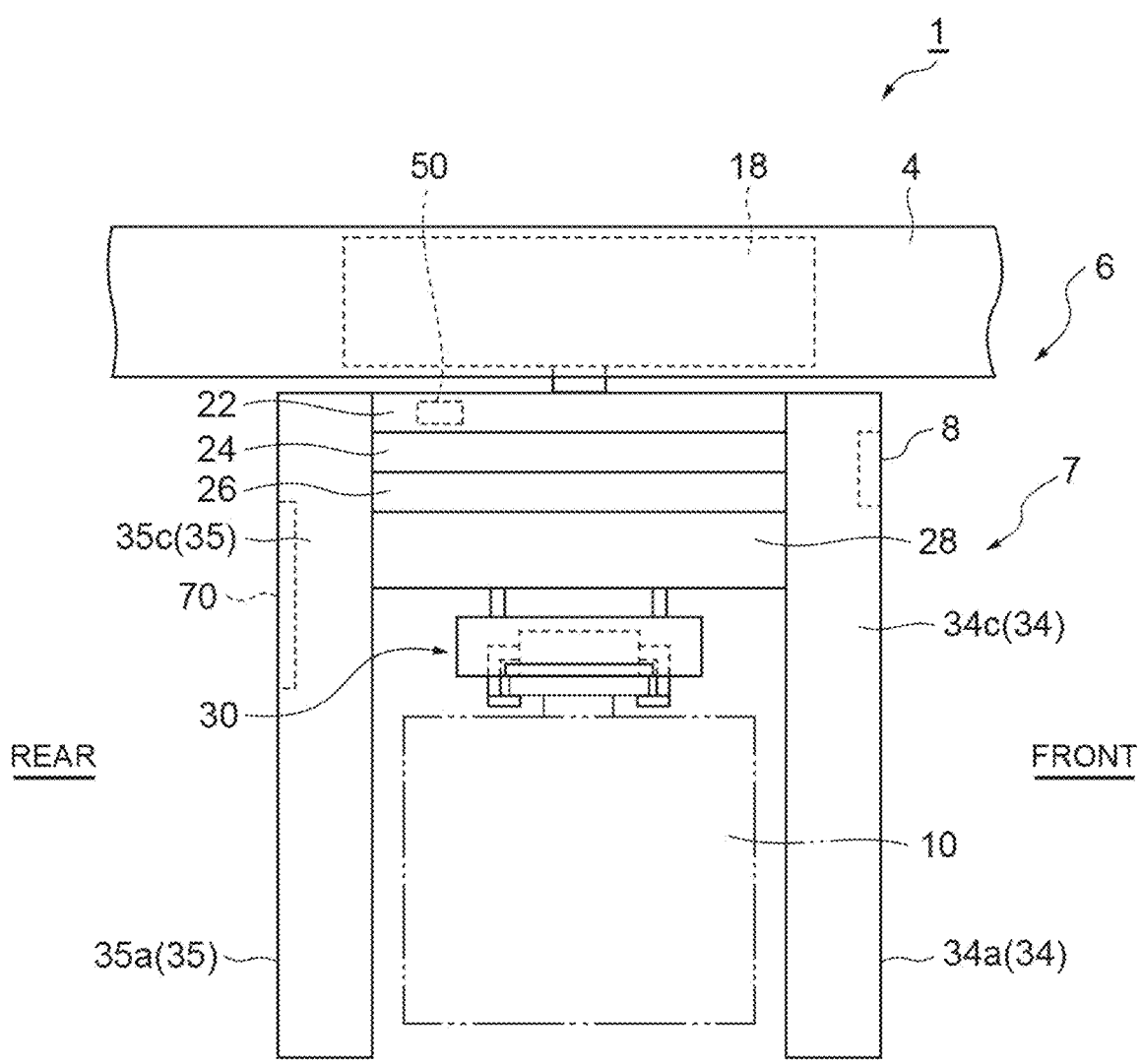
FIG. 2 is a side view illustrating a travelling vehicle according to the first preferred embodiment of the present invention as viewed from a side.

As illustrated in FIG. 2, the track 4 is laid, for example, in the vicinity of the ceiling that is a space above a worker's head. The track 4 is, for example, suspended from the ceiling.

As illustrated in FIG. 1 and FIG. 2, the placement sections 9 are arranged along the track 4 and provided at locations where the article 10 can be delivered to and from the travelling vehicle 6. The placement sections 9 each include a buffer and a delivery port. The buffer is a placement section on which the article 10 is temporarily placed. The buffer is a placement section on which the article 10 is temporarily placed when the article 10 transported by the travelling vehicle 6 is unable to be transferred to a target delivery port, for example, for the reason that another article 10 has been placed on the target delivery port. The delivery port is, for example, a placement section to deliver the article 10 to and from a semiconductor processing device (not illustrated) such as a cleaning device, a deposition device, a lithography device, an etching device, a thermal treatment device, and a planarization device. The processing device is not limited to a specific device and may be a variety of devices.

For example, the placement sections 9 are arranged to a side of the track 4. In this case, the travelling vehicle 6 delivers the article 10 to and from the placement section 9, by laterally feeding an elevation driver 28 or the like by a lateral feed unit 24 and by elevating and lowering an elevation unit 30. Although not illustrated, the placement section 9 may be arranged immediately below the track 4. In this case, the travelling vehicle 6 elevates and lowers the elevation unit 30 to deliver the article 10 to and from the placement section 9.

Figure 3:
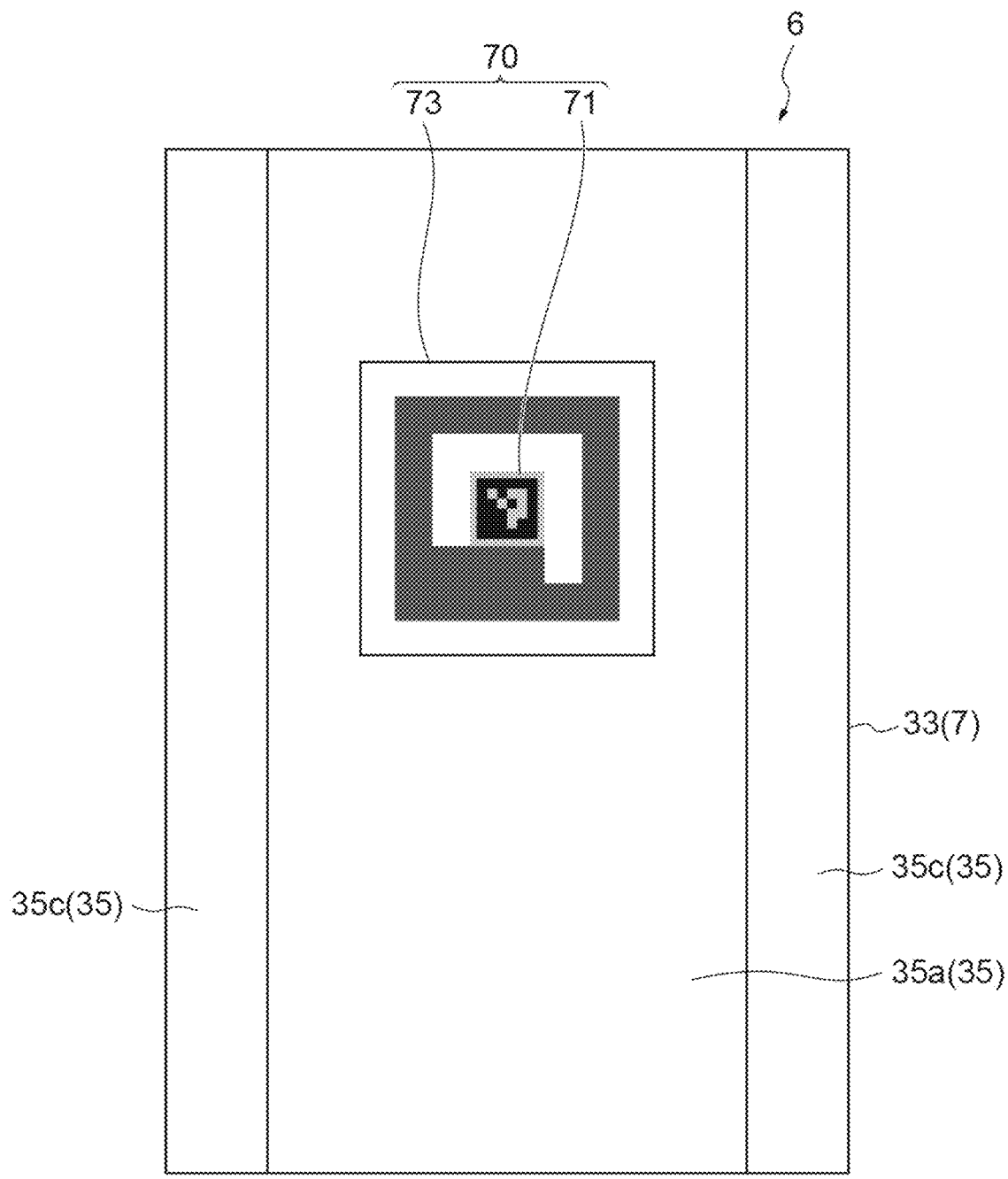
FIG. 3 is a rear view of a body of the travelling vehicle in FIG. 1 as viewed from the rear in a travelling direction.

As illustrated in FIG. 2, the travelling vehicle 6 travels along the track 4 and transports the article 10. The travelling vehicle 6 is configured so that the article 10 can be transferred. The travelling vehicle 6 is an automated overhead transport vehicle. The number of travelling vehicles 6 included in the travelling vehicle system 1 is not particularly limited and is more than one. As illustrated in FIG. 2 and FIG. 3, the travelling vehicles 6 each includes a travelling unit 18, a body 7, an imager 8, a marker 70, and a control unit 50.

The travelling unit 18 includes a motor or the like and causes the travelling vehicle 6 to travel along the track 4. The body 7 includes a body frame 22, the lateral feed unit 24, a θ drive 26, the elevation driver 28, the elevation unit 30, and a body cover 33.

The body frame 22 supports the lateral feed unit 24, the θ drive 26, the elevation driver 28, and the elevation unit 30. The lateral feed unit 24 laterally feeds the θ drive 26, the elevation driver 28, and the elevation unit 30 collectively in a direction perpendicular to the travelling direction of the track 4. The θ drive 26 turns at least one of the elevation driver 28 and the elevation unit 30 within a predetermined angle range in a horizontal plane. The elevation driver 28 elevates and lowers the elevation unit 30 by reeling or unreeling a hanging member such as a wire, rope, or belt. The elevation unit 30 includes a chuck and can freely grip or release the article 10.

The body cover 33 is provided at each of the front and the rear of the travelling vehicle 6. The body cover 33 extends and retracts a not-illustrated claw and prevents the article 10 from dropping during transportation. The body cover 33 includes a front cover 34 provided at the front of the travelling vehicle 6 and a rear cover 35 provided at the rear of the travelling vehicle 6 in the travelling direction. The front cover 34 preferably has a substantially isosceles trapezoidal shape in plan view when viewed from above, and includes a front surface 34*a* facing outward (forward), a rear surface 34*b* facing inward (rearward) where the elevation unit 30 is provided, and leg surfaces 34*c* and 34*c* connecting the front surface 34*a* and the rear surface 34*b*. The rear cover 35 preferably has a substantially isosceles trapezoidal shape in plan view when viewed from above, and includes a rear surface 35*a* facing outward (rearward), a front surface 35*b* facing inward (forward) where the elevation unit 30 is provided, and leg surfaces 35*c* and 35*c* connecting the rear surface 35*a* and front surface 35*b*.

The imager 8 is provided on the front surface 34*a* of the front cover 34 of the body 7 so that the image capturing range is in front of the travelling vehicle 6 that is the subject travelling vehicle. The imager 8 is a device that includes a lens and an imaging element or the like that converts light entering from the lens into an electrical signal. A captured image acquired by the imager 8 is acquired by the control unit 50 which will be described in detail in a subsequent paragraph.

Figure 4:
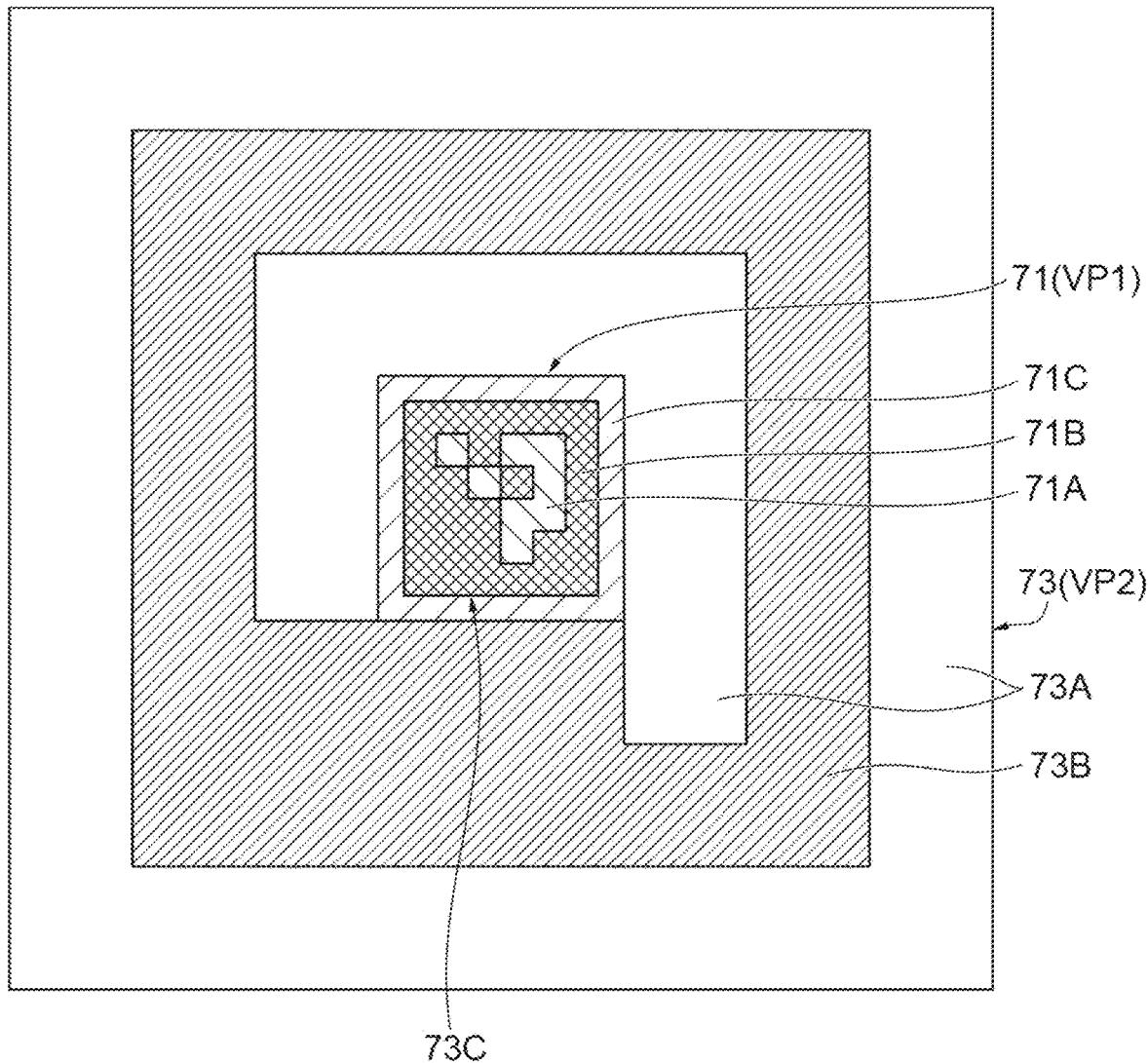
FIG. 4 is a diagram illustrating an example of a color scheme pattern for a large marker and a small marker provided on the body.
Figure 5A:
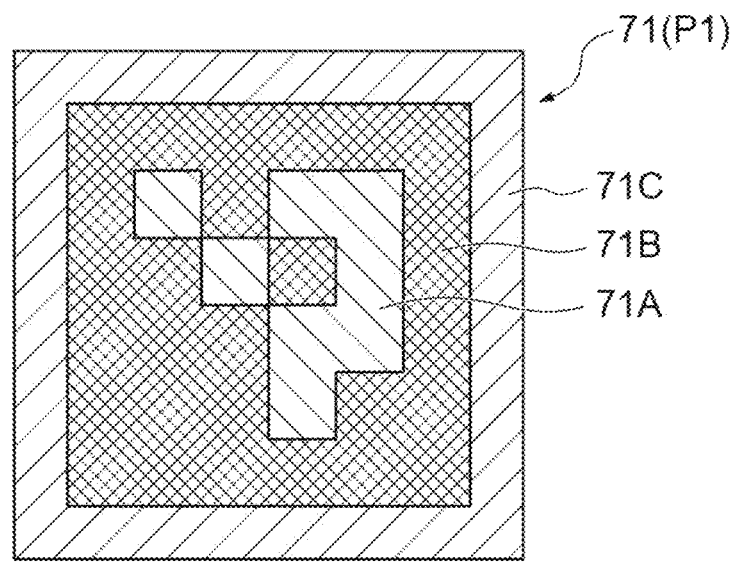
FIG. 5A is an example of a color scheme pattern for the small marker and FIG. 5B is an example of a color scheme pattern for the large marker.
Figure 5B:
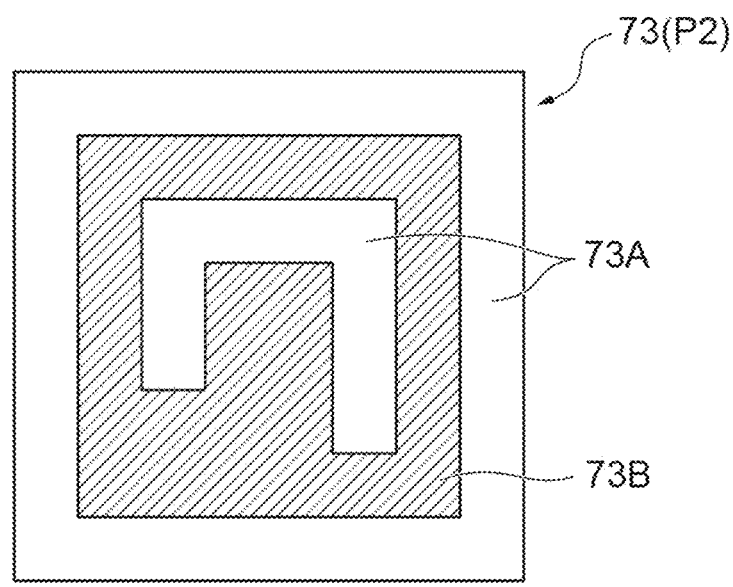

As illustrated in FIG. 3, the marker 70 is provided on the rear surface 35*a* of the rear cover 35 so as to be visible from other travelling vehicle 6 (hereinafter referred to as "following travelling vehicle 6") located at the rear of the subject travelling vehicle 6. The marker 70 includes a small marker 71 and a large marker 73, as illustrated in FIG. 4. The large marker 73 has a larger surface area than that of the small marker 71, and a display pattern VP2 includes a first region 73A, a second region 73B with lower reflectance than that of the first region 73A, and a region 73C where the small marker 71 is arranged.

The small marker 71 is arranged on the region 73C inside the region where the large marker 73 is configured. The center (center of gravity) position of the region that constitutes the small marker 71 may coincide with the center (center of gravity) position of the region that constitutes the large marker 73. The display pattern VP1 includes a third region 71A with a lower reflectance than that of the first region 73A, a fourth region 71B with a lower reflectance than that of the third region 71A and that of the second region 73B, and a fifth region 71C that encompasses the third region 71A and the fourth region 71B and has a lower reflectance than that of the first region 73A of the large marker 73 and a higher reflectance that of than the fourth region 71B.

The reflectance in the present preferred embodiment is the reflectance when visible light is used for irradiation, and the relation between the reflectances of the regions is "the first region 73A>the third region 71A and the fifth region 71C>the second region 73B>the fourth region 71B". In the present preferred embodiment, the third region 71A and the fifth regions 71C of the small marker 71 are light gray and the fourth region 71B is black, while the first region 73A of the large marker 73 is white and the second region 73B is dark gray. In other words, the relation between the brightnesses of the regions is configured so that "the first region 73A>the third region 71A and the fifth region 71C>the second region 73B>the fourth region 71B", resulting in the above relation of reflectances.

Here, brightness is used as an example of a factor that determines reflectance to visible light, but it can also be color density, saturation, and the like. It may also be the reflectances of the small marker 71 and the large marker 73 to infrared light. Again, the reflectances of the regions in the small marker 71 and the large marker 73 have the relation described above.

The large marker 73 preferably has a size that does not entirely fit within the image capturing range of the imager 8 equipped in the following travelling vehicle (the other travelling vehicle) 6 located at a position at which a distance from the subject travelling vehicle 6 is less than a predetermined distance (for example, about 0.5 m). The small marker 71 preferably has a size that entirely fits within the image capturing range of the imager 8 equipped in the following travelling vehicle 6 even if the distance from the subject travelling vehicle 6 is less than the predetermined distance (for example, about 0.5 m).

In this case, "the small marker 71 entirely fits within the image capturing range" includes not only the case of being captured in a size that is extracted (recognized) by a pattern recognition unit 51 which will be described in detail in a subsequent paragraph but also the case of being captured in a size that is not extracted (recognized) by the pattern recognition unit 51. That is, the position where the small marker 71 is placed only needs to be equipped in the image capturing range. In addition, it does not matter whether the imager 8 is in focus. Moreover, "even if the distance is less than the above-described predetermined distance" in this case may be the case where the distance at which the travelling vehicles 6 and 6 at the front and the rear can come close to each other is of the lower limit value.

The small marker 71 and the large marker 73 may be directly drawn on the rear cover 35, or a plate or the like on which the small marker 71 and the large marker 73 are drawn may be fixed to the rear cover 35. The images of the small marker 71 and the large marker 73 may be displayed on a display unit such as a liquid crystal display provided on the rear cover 35.

Figure 6:
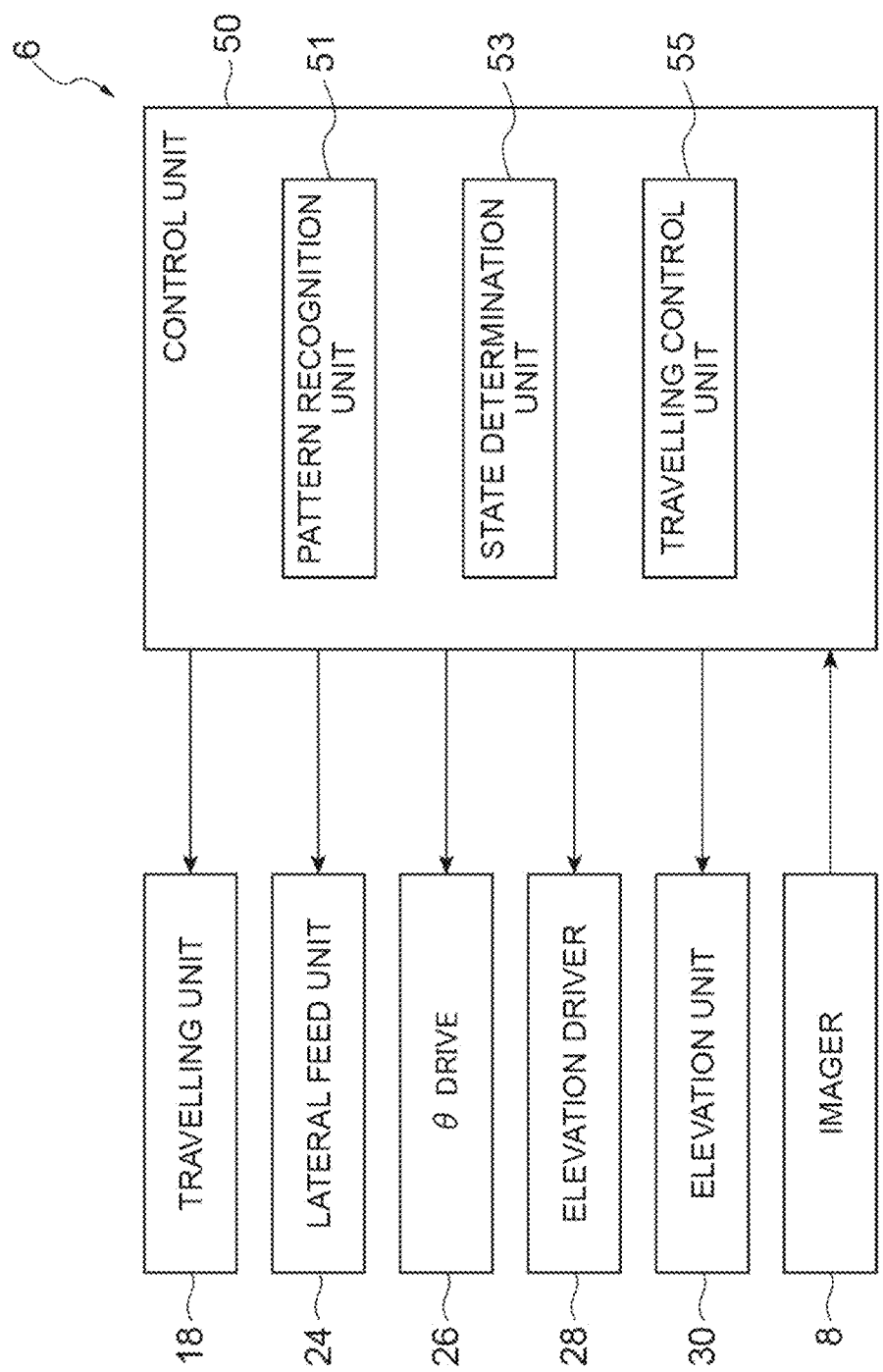
FIG. 6 is a block diagram illustrating a functional configuration of the travelling vehicle in FIG. 1.

The control unit 50 is an electronic control unit including a central processing unit (CPU), a read only memory (ROM), and a random access memory (RAM). The control unit 50 controls various operations in the travelling vehicle 6. Specifically, as illustrated in FIG. 6, the control unit 50 controls the travelling unit 18, the lateral feed unit 24, the θ drive 26, the elevation driver 28, the elevation unit 30, and the imager 8. The control unit 50 can be configured, for example, as software that is a program stored in the ROM, loaded into the RAM, and executed by the CPU. The control unit 50 may be configured as hardware with electronic circuitry, for example. In the control unit 50, as the hardware such as the CPU, the RAM, and the ROM, and the software such as the program collaborate, the pattern recognition unit 51, a state determination unit 53, and a travelling control unit 55 as described below are formed. The control unit 50 communicates with a controller 60 using a communication line (feeder line) of the track 4.

The pattern recognition unit 51 attempts to recognize (extract) the marker 70 from a captured image acquired by the imager 8. The pattern recognition unit 51 recognizes the small marker 71 based on a first image in which the small marker 71 is entirely equipped in the image capturing range of the imager 8 and the large marker 73 is not entirely equipped in the image capturing range, and also recognizes the large marker 73 based on a second image in which the small marker 71 and the large marker 73 are entirely equipped in the image capturing range. More specifically, the pattern recognition unit 51 recognizes the small marker 71 by recognizing a first color scheme pattern P1 illustrated in FIG. 5A, which is obtained by binarizing the small marker 71 in the first image so that the region corresponding to the third region 71A is white and the region corresponding to the fourth region 71B is black. The pattern recognition unit 51 also recognizes the large marker 73 by recognizing a second color scheme pattern P2 illustrated in FIG. 5B, which is obtained by binarizing the large marker 73 in the second image so that the region corresponding to the first region 73A is white and the regions corresponding to the second region 73B and the region of the small marker 71 are black.

Based on the recognition of the small marker 71 or the large marker 73 by the pattern recognition unit 51, the state determination unit 53 determines whether another travelling vehicle 6 (hereinafter referred to as "preceding travelling vehicle 6") located at the front of the subject travelling vehicle 6 is present. The state determination unit 53 determines that the preceding travelling vehicle 6 is present when at least one of the entire small marker 71 and the entire large marker 73 is extracted from a captured image. When the small marker 71 is recognized by the pattern recognition unit 51, the state determination unit 53 in the present preferred embodiment determines that the distance from the subject travelling vehicle 6 to the preceding travelling vehicle 6 is smaller than that when the large marker 73 is recognized. More specifically, the state determination unit 53 determines that the distance from the subject travelling vehicle 6 to the preceding travelling vehicle 6 is less than about 0.5 m, for example, when the pattern recognition unit 51 recognizes the small marker 71, and the distance from the subject travelling vehicle 6 to the preceding travelling vehicle 6 is about 0.5 m or more, for example, when the large marker 73 is recognized.

When the large marker 73 is recognized by the pattern recognition unit 51, the travelling control unit 55 controls the travelling unit 18 to travel at a speed slower than a normal moving speed, for example. When the small marker 71 is recognized by the pattern recognition unit 51, the travelling control unit 55 controls the travelling unit 18 to come to a complete stop. This control is an example, and the control performed when the small marker 71 or the large marker 73 is distinctively recognized by the pattern recognition unit 51 is not limited to the above control.

The controller 60 is an electronic control unit including a CPU, a ROM, a RAM, and the like. The controller 60 can be configured, for example, as software that is a program stored in the ROM, loaded into the RAM, and executed by the CPU. The controller 60 may be configured as hardware with electronic circuitry, for example. The controller 60 transmits a transportation command to the travelling vehicle 6 to transport the article 10.

Next, the operation and effect of the travelling vehicle system 1 of the above-described first preferred embodiment will be described. In the travelling vehicle system 1 of the above-described first preferred embodiment, even when the inter-vehicle distance between two of the travelling vehicles 6 and 6 is relatively close, the pattern recognition unit 51 can recognize the small marker 71 because the small marker 71 is captured by the imager 8. In the travelling vehicle system 1 of the above-described first preferred embodiment, when the inter-vehicle distance between the two travelling vehicles 6 and 6 is relatively far, the small marker 71 and the large marker 73 are captured by the imager 8, but the display pattern VP2 is USED in which the third region 71A of the small marker 71 has a lower reflectance than that of the first region 73A of the large marker 73 and the fourth region 71B of the small marker 71 has a lower reflectance than that of the second region 73B of the large marker 73, the pattern recognition unit 51 can easily recognize the entire small marker 71 as the second region 73B of the large marker 73. This allows the pattern recognition unit 51 to more reliably recognize the large marker 73 from a captured image in which the small marker 71 and large marker 73 are captured. In other words, for a captured image in which both the small marker 71 and the large marker 73 are captured, although the small marker 71 is difficult to be recognized as a single marker, the pattern recognition unit 51 recognizes elements of the small marker 71 as part of the large marker 73, making it easier to recognize the large marker 73. As a result, the travelling vehicle 6 can more reliably recognize the preceding travelling vehicle 6 regardless of the inter-vehicle distance between the two travelling vehicles 6 and 6.

In the travelling vehicle system 1 of the above-described first preferred embodiment, the small marker 71 has the third region 71A and the fourth region 71B arranged inside the fifth region 71C that defines a frame, and the fifth region 71C has a lower reflectance than that of the first region 73A of the large marker 73 and a higher reflectance than that of the fourth region 71B of the small marker 71. This allows the pattern recognition unit 51 to more reliably recognize the large marker 73 from a captured image in which the small marker 71 and the large marker 73 are captured.

In the travelling vehicle system 1 of the above-described first preferred embodiment, the pattern recognition unit 51 recognizes the small marker 71 by recognizing the first color scheme pattern P1 (refer to FIG. 5A), which is obtained by binarizing the small marker 71 so that the region corresponding to the third region 71A is white and the region corresponding to the fourth region 71B is black. The pattern recognition unit 51 also recognizes the large marker 73 by recognizing the second color scheme pattern P2 (refer to FIG. 5B), which is obtained by binarizing the large marker 73 so that the region corresponding to the first region 73A of the large marker 73 is white and the regions corresponding to the second region 73B and the region of the small marker 71 are black. This allows the pattern recognition unit 51 to recognize the small marker 71 and large marker 73 from a captured image using a simple processing method.

In the travelling vehicle system 1 of the above-described first preferred embodiment, the color scheme of the display pattern VP2 of the large marker 73 and the color scheme of the display pattern VP1 of the small marker 71 are different from each other. When the small marker 71 is recognized by the pattern recognition unit 51, the state determination unit 53 determines that the distance from the subject travelling vehicle 6 to the preceding travelling vehicle 6 is smaller than that when the large marker 73 is recognized. This allows for detection of the distance to a travelling vehicle 6 located at the front or the rear without deploying a sensor or another device.

Second Preferred Embodiment

Figure 7:
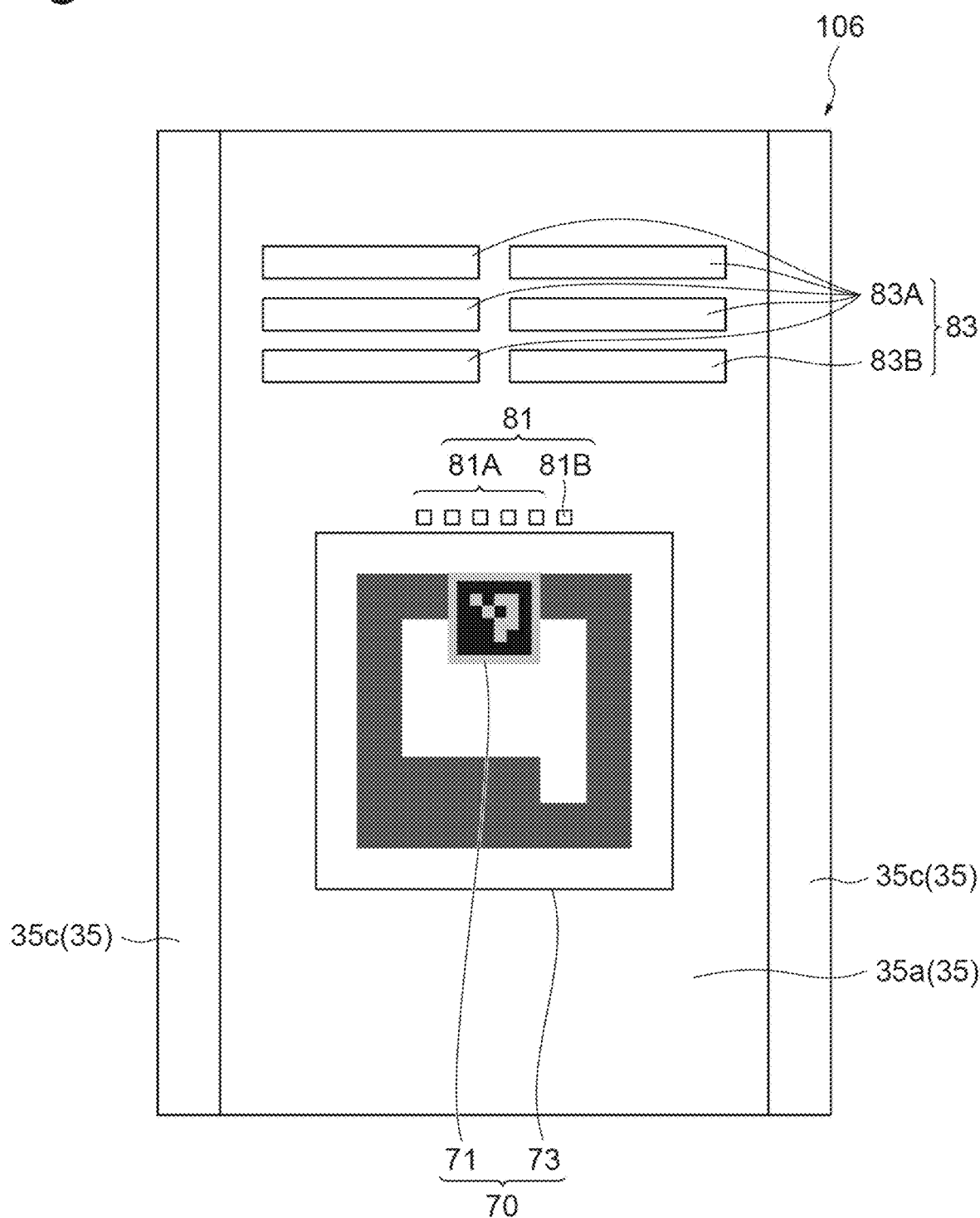
FIG. 7 is a rear view of a body of a travelling vehicle according to a second preferred embodiment of the present invention as viewed from the rear in the travelling direction.
Figure 8:
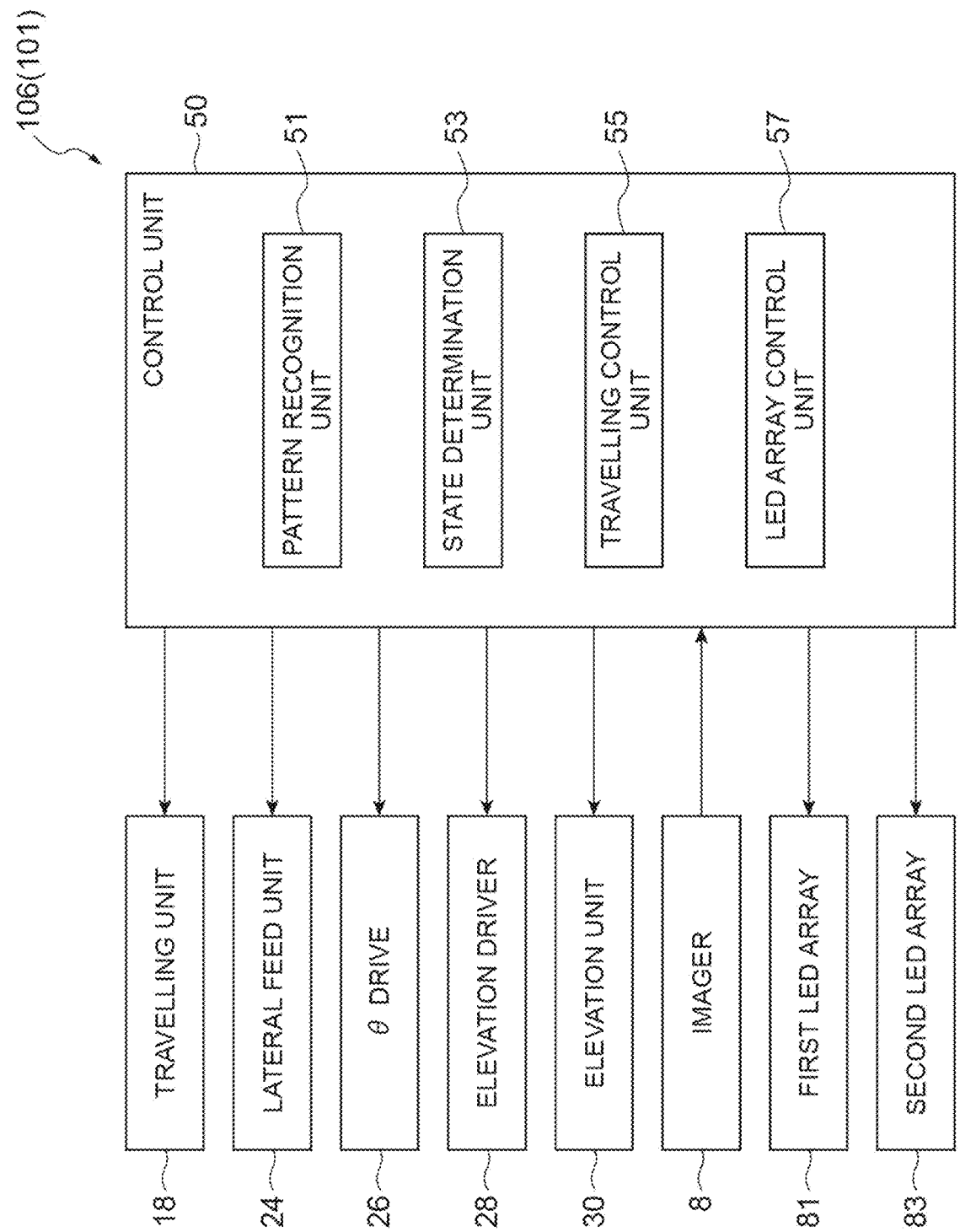
FIG. 8 is a block diagram illustrating a functional configuration of the travelling vehicle according to the second preferred embodiment of the present invention.

With reference to FIG. 7 to FIG. 8 mainly, a travelling vehicle system 101 of a second preferred embodiment will be described. The travelling vehicle system 101 of the second preferred embodiment is provided with a first LED array (first display unit) 81, a second LED array (second display unit) 83, and an LED array control unit 57 in addition to the configuration of the travelling vehicle system 1 of the first preferred embodiment. The first LED array 81, the second LED array 83, and the LED array control unit 57 are described in detail here.

As illustrated in FIG. 6, the first LED array 81 and the second LED array 83 are arranged on the rear cover 35 of a travelling vehicle 106. The first LED array 81 is arranged such that it entirely fits within the image capturing range of the imager 8 equipped in a preceding travelling vehicle 106 even if the distance from a subject travelling vehicle 106 is less than a predetermined distance (for example, about 0.5 m). The second LED array 83 is arranged such that it does not entirely fit within the image capturing range of the imager 8 equipped in the preceding travelling vehicle 106 locate at a position at which the distance from the subject travelling vehicle 106 is less than a predetermined distance (for example, about 0.5 m). The first LED array 81 and the second LED array 83 may be arranged on the front cover 34 of the travelling vehicle 106.

The first LED array 81 is an LED unit including an array of a plurality of (for example, six) LEDs 81A and 81B. The second LED array 83 is an LED unit including an array of a plurality of (for example, six) LEDs 83A and 83B. The first LED array 81 and the second LED array 83 switch a display manner according to a state of the subject travelling vehicle 106 (the travelling vehicle 106 provided with the first LED array 81 and the second LED array 83).

Specifically, the first LED array 81 changes a display manner with a combination of an illuminated LED 81A and a not-illuminated LED 81A among five LEDs 81A (hereinafter simply referred to as "combination of illumination"). One LED 81B that remains is used as a parity. That is, the LED 81B is used to determine whether a combination of illumination of five LEDs 81A is the display manner intended by the control unit 50. The switching of display manners in the first LED array 81 is performed by the control unit 50. Similarly to the first LED array 81, the second LED array 83 changes a display manner with a combination of an illuminated LED 83A and a not-illuminated LED 83A among five LEDs 83A. One LED 83B that remains is used as a parity, which is also similar to the first LED array 81.

In the control unit 50, in addition to forming the pattern recognition unit 51, the state determination unit 53, and the travelling control unit 55 as described above, the LED array control unit 57 is formed. The LED array control unit 57 switches display manners of the first LED array 81 and the second LED array 83 according to a travelling state of the subject travelling vehicle 106. Specifically, for example, when the LED array control unit 57 receives a command from the controller 60 and acquires that the travelling state of the subject travelling vehicle becomes an acceleration state or a deceleration state, the LED array control unit 57 controls illumination of the LEDs 81A in the first LED array 81 and illumination of the LEDs 83A in the second LED array 83 to attain a display manner corresponding to the acquired travelling state. In other words, the LED array control unit 57 transmits the travelling state of the subject travelling vehicle 106 to a travelling vehicle 106 located at the rear of the subject travelling vehicle 106 by switching display manners of the first LED array 81 and the second LED array 83 provided on the travelling vehicle 106.

For example, the following describes the operation of the following travelling vehicle 106 when the preceding travelling vehicle 106 decelerates. For example, in a case where the preceding travelling vehicle 106 detects an obstacle ahead with an obstacle sensor or the like, the preceding travelling vehicle 106 decelerates when the distance to the obstacle ahead is a predetermined distance and stops when the distance to the obstacle ahead is a second predetermined distance shorter than the previous predetermined distance. The preceding travelling vehicle 106 decelerates when the distance to the obstacle ahead is the predetermined distance and simultaneously indicates that the state of the subject travelling vehicle is the decelerated state with the first LED array 81 and the second LED array 83.

The travelling control unit 55 of the following travelling vehicle 106 determines the state of the preceding travelling vehicle 106 based on the combination of illumination of the first LED array 81 and the second LED array 83 that are captured by the imager 8. At the same time, the pattern recognition unit 51 of the following travelling vehicle 106 attempts to recognize the small marker 71 and the large marker 73 based on an image captured by the imager 8. Here, if the pattern recognition unit 51 recognizes the small marker 71, the preceding travelling vehicle 106 is determined to be less than about 0.5 m, for example, ahead of the following travelling vehicle 106, and the travelling control unit 55 stops the travelling unit 18. If the pattern recognition unit 51 recognizes the large marker 73, the preceding travelling vehicle 106 is determined to be at least about 0.5 m, for example, ahead of the following travelling vehicle 106, and the travelling control unit 55 decelerates the travelling unit 18.

For example, the following describes the operation of the following travelling vehicle 106 when the preceding travelling vehicle 106 accelerates. For example, when the preceding travelling vehicle 106 accelerates forward by receiving a transport command from the controller 60, or the like, it displays on the first LED array 81 and the second LED array 83 that the state of the subject travelling vehicle is in the accelerated state. The travelling control unit 55 of the following travelling vehicle 106 determines the state of the preceding travelling vehicle 106 based on the combination of illumination of the first LED array 81 and the second LED array 83 that are captured by the imager 8. At the same time, the pattern recognition unit 51 of the following travelling vehicle 106 attempts to recognize the small marker 71 and the large marker 73 based on an image captured by the imager 8. Here, if the pattern recognition unit 51 recognizes the large marker 73, the preceding travelling vehicle 106 is determined to be at least about 0.5 m, for example, ahead of the following travelling vehicle 106, and the travelling control unit 55 accelerates the travelling unit 18. This allows the following travelling vehicle 106 to smoothly follow the preceding travelling vehicle 106. On the other hand, if the pattern recognition unit 51 recognizes the small marker 71, the preceding travelling vehicle 106 is determined to be less than about 0.5 m, for example, ahead of the following travelling vehicle 106, and immediately following of the preceding travelling vehicle is avoided and the current travelling state is maintained. This reduces the likelihood that the following travelling vehicle 106 will collide with the preceding travelling vehicle 106.

The operation and effect of the travelling vehicle system 101 in the above-described second preferred embodiment will be described. In the travelling vehicle system 101 of the above-described second preferred embodiment, since a display manner that varies according to a state of the travelling vehicle 106 is displayed on the first LED array 81 and the second LED array 83, the following travelling vehicle 106 that has acquired the display manners of the first LED array 81 and the second LED array 83 with the imager 8 can determine the state of the preceding travelling vehicle 106 instantaneously. With this configuration, the following travelling vehicle 106 can promptly perform operation appropriate for the state of the preceding travelling vehicle 106. In the travelling vehicle system 101 of the above-described second preferred embodiment, the first LED array 81 is arranged corresponding to the small marker 71 and the second LED array 83 is provided corresponding to the large marker 73, so that even if the inter-vehicle distance between the two travelling vehicles 106 and 106 is relatively close or far, the imager 8 captures at least one of the first LED array 81 and the second LED array 83. This allows the following travelling vehicle 106 to more reliably acquire information on the preceding travelling vehicle 106 regardless of the inter-vehicle distance between the two travelling vehicles 106 and 106.

In the travelling vehicle system 101 of the above-described second preferred embodiment, the first LED array 81 and the second LED array 83 switch their display manners according to the travelling state of the subject travelling vehicle 106, and the travelling state includes an acceleration state and a deceleration state. This configuration enables the following travelling vehicle 106 to grasp at least whether the preceding travelling vehicle 106 is in the accelerated state or the decelerated state.

Some preferred embodiments of the present invention and modifications thereof have been described above. However, the present invention is not limited to the above-described preferred embodiments. Various modifications and combinations can be made without departing from the gist of the present invention.

In the travelling vehicle 6 and the travelling vehicle system 1 of the above-described first preferred embodiment, an example has been described in which the imager 8 is provided, the imager 8 including a lens, and an imaging element or the like that converts light entering from the lens into an electrical signal, the imager 8 having no function of measuring the distance to and from a target object, but the first preferred embodiment is not limited thereto. As the imager 8, a device having a distance measuring function such as a stereo camera, a TOF camera, and the like may be used.

The travelling vehicle 6 (106) and the travelling vehicle system 1 of the above-described preferred embodiments and third modification have been described with an example in which the small marker 71 and large marker 73 are formed as display patterns consisting of shapes in a plurality of colors (for example, AR markers), but they may also be, for example, two-dimensional codes. Examples of the two-dimensional code include a QR code (registered trademark), for example. The above-described preferred embodiments and modifications have been described with an example in which the display patterns of the small marker 71 and the large marker 73 are different from each other, but the display patterns may be the same for each other.

The above-described preferred embodiments and modifications have been described with an example in which the control unit 50 that controls the travelling vehicle 6 (106) is provided in the body 7 of the individual travelling vehicle 6 (106), but the control unit 50 may be separated from the body 7 and placed at a position where the control unit 50 can perform communication by wire or wirelessly (for example, the controller 60). In such a case, the control unit 50 may be configured to collectively control a plurality of travelling vehicles 6 (106) instead of being provided for each of the travelling vehicles 6.

The travelling vehicle 6 (106) and the travelling vehicle system 1 of the above-described preferred embodiments and modifications have been described with an overhead travelling vehicle as one example of the travelling vehicle, but other examples of the travelling vehicle include an unmanned vehicle, a stacker crane, and the like that travel on a track laid out on the ground or a frame.

The travelling vehicle 6 (106) and the travelling vehicle system 1 of the above-described preferred embodiments and modifications have been described with an example in which the small marker 71 and the large marker 73 are provided on the rear surface 35a of the rear cover 35, but the position at which the markers are provided is not limited as long as it is a position visible from other travelling vehicle 6 (106). For example, the small marker 71 and the large marker 73 may be provided on the leg surfaces 35c and 35c instead of or in addition to the rear surface 35a. Furthermore, the above-described preferred embodiments and modifications have been described with an example in which the small marker 71 and the large marker 73 are arranged at a position on the preceding travelling vehicle 6, the position being visible from the following travelling vehicle 6 (i.e., the rear surface 35a of the preceding travelling vehicle 6), but the small marker 71 and large marker 73 may be arranged at a position on the following travelling vehicle 6, the position visible from the preceding travelling vehicle 6 (e.g., the front surface 34a, the leg surfaces 34c and 34c, and the like of the following travelling vehicle 6).

The travelling vehicle 6 (106) and the travelling vehicle system 1 of the above-described preferred embodiments and modifications have been described with an example in which the first LED array 81 and the second LED array 83 are used as the first display unit and the second display unit that switch a display manner according to the state of the subject travelling vehicle. However, the present invention is not limited thereto. For example, a liquid crystal display screen may be USED, and display contents (color, pattern, symbol, character, etc.) may be changed according to the state of the subject travelling vehicle. Alternatively, an illumination device that simply switches colors to be displayed (emitted) may be USED.

The travelling vehicle 6 (106) and the travelling vehicle system 1 of the above-described preferred embodiments and modifications have been described with an example in which the acceleration state and the deceleration state are described as examples of the state of the subject travelling vehicle, but it could be, for example, the current position of the subject travelling vehicle, or information such as whether an article 10 is being conveyed.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A travelling vehicle to travel along a predetermined travelling path, the travelling vehicle comprising:
a body including a small marker and a large marker with a larger surface area than a surface area of the small marker;
at least one imager provided on the body such that an image capturing range of the at least one imager includes at least one of a front and a rear of the travelling vehicle that is a subject travelling vehicle;
a pattern recognizer to distinctively recognize the small marker and the large marker based on a captured image acquired by the at least one imager; and
a state determiner to determine that the travelling vehicle that is another travelling vehicle is present in at least one of the front and the rear of the subject travelling vehicle when the small marker or the large marker is recognized by the pattern recognizer; wherein
the large marker is of a size that does not entirely fit within the image capturing range of the at least one imager in the other travelling vehicle that is located less than a predetermined distance from the subject travelling vehicle;
the small marker is of a size that entirely fits within the image capturing range of the at least one imager in the other travelling vehicle when a distance from the subject travelling vehicle is less than the predetermined distance from the subject travelling vehicle, the small marker being located inside a region where the large marker is located;
the large marker includes a display pattern including a first region, a second region with a lower reflectance than a reflectance of the first region, and a region where the small marker is located; and
the small marker includes a display pattern including a third region with a lower reflectance than the reflectance of the first region and a fourth region with a lower reflectance than the reflectance of the third region and a lower reflectance than the reflectance of the second region.

2. The travelling vehicle according to claim 1, wherein the small marker includes the third region and the fourth region inside a fifth region defining a frame; and
the fifth region has a lower reflectance than the reflectance of the first region of the large marker and a higher reflectance than the reflectance of the fourth region of the small marker.

3. The travelling vehicle according to claim 2, wherein the pattern recognizer is operable to recognize the small marker by recognizing a first color scheme pattern obtained by binarizing the small marker so that a region corresponding to the third region is white and a region corresponding to the fourth region is black, and recognize the large marker by recognizing a second color scheme pattern obtained by binarizing the large marker so that a region corresponding to the first region is white and regions corresponding to the second region and the regions of the small marker are black.

4. The travelling vehicle according to claim 2, wherein the large marker and the small marker have different display patterns from each other; and
the state determiner is operable to determine that a distance from the subject travelling vehicle to the other travelling vehicle is smaller when the small marker is recognized by the pattern recognizer compared to when the large marker is recognized by the pattern recognizer.

5. The travelling vehicle according to claim 2, wherein the body further includes a first display that does not entirely fit within the image capturing range of the at least one imager in the other travelling vehicle that is located less than the predetermined distance from the subject travelling vehicle, the first display being operable to switch a display mode in accordance with a state of the subject travelling vehicle, and a second display that entirely fits within the image capturing range of the at least one imager in the other travelling vehicle when a distance from the subject travelling vehicle is less than the predetermined distance from the subject travelling vehicle, the second display being operable to switch a display mode in accordance with a state of the subject travelling vehicle;
the travelling vehicle further comprising:
a driver to cause the body to travel along the travelling path; and
a travelling controller configured or programmed to acquire a state of the other travelling vehicle based on the display mode of at least one of the first display and the second display captured by the at least one imager and control the driver based on the state that has been acquired.

6. The travelling vehicle according to claim 1, wherein the pattern recognizer is operable to recognize the small marker by recognizing a first color scheme pattern obtained by binarizing the small marker so that a region corresponding to the third region is white and a region corresponding to the fourth region is black, and recognize the large marker by recognizing a second color scheme pattern obtained by binarizing the large marker so that a region corresponding to the first region is white and regions corresponding to the second region and the regions of the small marker are black.

7. The travelling vehicle according to claim 6, wherein
the large marker and the small marker have different display patterns from each other; and
the state determiner is operable to determine that a distance from the subject travelling vehicle to the other travelling vehicle is smaller when the small marker is recognized by the pattern recognizer compared to when the large marker is recognized by the pattern recognizer.

8. The travelling vehicle according to claim 7, wherein
the body further includes a first display that does not entirely fit within the image capturing range of the at least one imager in the other travelling vehicle that is located less than the predetermined distance from the subject travelling vehicle, the first display being operable to switch a display mode in accordance with a state of the subject travelling vehicle, and a second display that entirely fits within the image capturing range of the at least one imager in the other travelling vehicle when a distance from the subject travelling vehicle is less than the predetermined distance from the subject travelling vehicle, the second display being operable to switch a display mode in accordance with a state of the subject travelling vehicle;
the travelling vehicle further comprising:
a driver to cause the body to travel along the travelling path; and
a travelling controller configured or programmed to acquire a state of the other travelling vehicle based on the display mode of at least one of the first display and the second display captured by the at least one imager and control the driver based on the state that has been acquired.

9. The travelling vehicle according to claim 6, wherein
the body further includes a first display that does not entirely fit within the image capturing range of the at least one imager in the other travelling vehicle that is located less than the predetermined distance from the subject travelling vehicle, the first display being operable to switch a display mode in accordance with a state of the subject travelling vehicle, and a second display that entirely fits within the image capturing range of the at least one imager in the other travelling vehicle when a distance from the subject travelling vehicle is less than the predetermined distance from the subject travelling vehicle, the second display being operable to switch a display mode in accordance with a state of the subject travelling vehicle;
the travelling vehicle further comprising:
a driver to cause the body to travel along the travelling path; and
a travelling controller configured or programmed to acquire a state of the other travelling vehicle based on the display mode of at least one of the first display and the second display captured by the at least one imager and control the driver based on the state that has been acquired.

10. The travelling vehicle according to claim 1, wherein
the large marker and the small marker have different display patterns from each other; and
the state determiner is operable to determine that a distance from the subject travelling vehicle to the other travelling vehicle is smaller when the small marker is recognized by the pattern recognizer compared to when the large marker is recognized by the pattern recognizer.

11. The travelling vehicle according to claim 10, wherein
the body further includes a first display that does not entirely fit within the image capturing range of the at least one imager in the other travelling vehicle that is located less than the predetermined distance from the subject travelling vehicle, the first display being operable to switch a display mode in accordance with a state of the subject travelling vehicle, and a second display that entirely fits within the image capturing range of the at least one imager in the other travelling vehicle when a distance from the subject travelling vehicle is less than the predetermined distance from the subject travelling vehicle, the second display being operable to switch a display mode in accordance with a state of the subject travelling vehicle;
the travelling vehicle further comprising:
a driver to cause the body to travel along the travelling path; and
a travelling controller configured or programmed to acquire a state of the other travelling vehicle based on the display mode of at least one of the first display and the second display captured by the at least one imager and control the driver based on the state that has been acquired.

12. The travelling vehicle according to claim 1, wherein
the body further includes a first display that does not entirely fit within the image capturing range of the at least one imager in the other travelling vehicle that is located less than the predetermined distance from the subject travelling vehicle, the first display being operable to switch a display mode in accordance with a state of the subject travelling vehicle, and a second display that entirely fits within the image capturing range of the at least one imager in the other travelling vehicle when a distance from the subject travelling vehicle is less than the predetermined distance from the subject travelling vehicle, the second display being operable to switch a display mode in accordance with a state of the subject travelling vehicle;
the travelling vehicle further comprising:
a driver to cause the body to travel along the travelling path; and
a travelling controller configured or programmed to acquire a state of the other travelling vehicle based on the display mode of at least one of the first display and the second display captured by the at least one imager and control the driver based on the state that has been acquired.

13. The travelling vehicle according to claim 12, wherein
the first display and the second display each switch the display mode according to a travelling state of the subject travelling vehicle; and
the travelling state includes an accelerated state and a decelerated state.

14. A travelling vehicle system comprising:
a plurality of the travelling vehicles according to claim 1;
a track along which the plurality of travelling vehicles travel in a predetermined direction; and
a travelling vehicle controller configured or programmed to assign a transportation command to the travelling vehicles.

15. The travelling vehicle according to claim 14, wherein the large marker and the small marker have different display patterns from each other; and
the state determiner is operable to determine that a distance from the subject travelling vehicle to the other travelling vehicle is smaller when the small marker is recognized by the pattern recognizer compared to when the large marker is recognized by the pattern recognizer.

16. The travelling vehicle according to claim 14, wherein the body further includes a first display that does not entirely fit within the image capturing range of the at least one imager in the other travelling vehicle that is located less than the predetermined distance from the subject travelling vehicle, the first display being operable to switch a display mode in accordance with a state of the subject travelling vehicle, and a second display that entirely fits within the image capturing range of the at least one imager in the other travelling vehicle when a distance from the subject travelling vehicle is less than the predetermined distance from the subject travelling vehicle, the second display being operable to switch a display mode in accordance with a state of the subject travelling vehicle;

the travelling vehicle further comprising:
    a driver to cause the body to travel along the travelling path; and
    a travelling controller configured or programmed to acquire a state of the other travelling vehicle based on the display mode of at least one of the first display and the second display captured by the at least one imager and control the driver based on the state that has been acquired.

\* \* \* \* \*